(12) United States Patent
Lee et al.

(10) Patent No.: US 7,276,297 B2
(45) Date of Patent: Oct. 2, 2007

(54) ORGANIC ELECTROLUMINESCENT DEVICE

(75) Inventors: Ho Nyun Lee, Seoul (KR); Hong Seok Choi, Seoul (KR)

(73) Assignee: LG Electroincs Inc., Seoul (KR)

( * ) Notice: Subject to any disclaimer, the term of this patent is extended or adjusted under 35 U.S.C. 154(b) by 95 days.

(21) Appl. No.: 10/910,363

(22) Filed: Aug. 4, 2004

(65) Prior Publication Data
US 2005/0031901 A1  Feb. 10, 2005

(30) Foreign Application Priority Data
Aug. 5, 2003  (KR) .................... 10-2003-0054122

(51) Int. Cl.
*H01L 51/50* (2006.01)
(52) U.S. Cl. .................... 428/690; 428/917; 313/504; 313/506
(58) Field of Classification Search ............... 428/690, 428/917; 313/504, 506
See application file for complete search history.

(56) References Cited
U.S. PATENT DOCUMENTS
6,366,017 B1 *  4/2002  Antoniadis et al. ......... 313/506

2002/0117962 A1 *  8/2002  Beierlein et al. ........... 313/504
2003/0164679 A1 *  9/2003  Hamano et al. ............ 313/504
2003/0230972 A1 * 12/2003  Cok .......................... 313/504

FOREIGN PATENT DOCUMENTS
KR  10-2003-0002182  1/2003

OTHER PUBLICATIONS
Office Action issued by the Korean Intellectual Property Office, no date.

* cited by examiner

*Primary Examiner*—Dawn L. Garrett
(74) *Attorney, Agent, or Firm*—KED & Associates, LLP

(57) ABSTRACT

The present invention provides an organic EL device, by which optical efficiency and stability of the organic EL device are enhanced by providing an anode of high reflectivity, high work function, superior environmental characteristic, and favorable corrosion resistance to a top-emission type organic EL device. The present invention includes an anode, an organic layer on the anode, and a cathode on the organic layer, wherein the anode comprises a reflective layer reflecting light emitted from the organic layer and a hole injection layer on the reflective layer injecting holes.

5 Claims, 3 Drawing Sheets

A : Al
B : Cr on Al 20Å
C : Cr on Al 30Å
D : Cr on Al 70Å
E : Cr on Al 110Å
F : Cr

A : Al
B : Al-2at.% Nd
C : Cr(30Å) on Al-2at.% Nd
D : Cr, 10mTorr

A : Ag
B : Cr on Ag 20Å
C : Cr on Ag 70Å
D : Cr on Ag 110Å
E : Cr

ORGANIC ELECTROLUMINESCENT DEVICE

This application claims the benefit of the Korean Application No. P2003-54122 filed on Aug. 5, 2003, which is hereby incorporated by reference.

BACKGROUND OF THE INVENTION

1. Field of the Invention

The present invention relates to an organic electroluminescent (EL) device, and more particularly, to an anode of an organic EL device, by which optical efficiency and stability of the organic EL device is enhanced.

2. Discussion of the Related Art

Generally, an organic electroluminescent (hereinafter abbreviated EL) device emits light in a manner that an electron and hole are recombined to be annihilated by injecting an electric charge into an organic layer between an electron injection electrode (cathode) and a hole injection electrode (anode).

The organic EL device is a next generation display device that can be driven by a low voltage with less power consumption.

The organic EL device can be categorized according to a light-emitting mechanism into a bottom-emission type of emitting light toward a substrate and a top-emission type of emitting light toward an opposite side of substrate.

The top-emission type organic EL device consists of an anode on a substrate to receive an injected hole therein and to play a role of a reflective layer of emitted light, an organic layer including at least one layer of organic matter, and a cathode receiving an injected electron to transmit the emitted light.

Among the elements of the organic EL device, the anode needs features of high work function, high reflectivity, low resistance, low surface illumination intensity, high adhesion to substrate, high etching feasibility, superior environmental characteristic, etc.

Al or Al-alloy is generally used in forming a reflective layer adopted by an optical record medium such as CD, DVD, and the lime or an optical reflective layer frequently adopted by a reflective type STN liquid crystal display device, organic EL device, and the like.

Al or Al-alloy layer has favorable reflectivity (80%~90%) and low electric resistance. An intensified $Al_2O_3$ layer is formed on a surface of the Al or Al-alloy layer. Hence, the Al or Al-alloy layer has stable corrosion resistance at an ambience of air.

Accordingly, many efforts were made to apply the Al or Al-alloy to an anode of the top-emission type organic EL device. Yet, the work function of the organic EL device is low to reduce the I-V characteristic and optical efficiency.

In the top-emission type organic EL device, an anode material employs such a single element of high work function as Cr, Ni, Mo, Ag, and the like or an alloy containing at least two of the elements.

However, such a substance as Cr, Ni, Mo, and the like has high work function but shows low reflectivity. The Ag single element or its alloy has high work function and reflectivity but shows inferior environmental characteristic and poor corrosion resistance.

SUMMARY OF THE INVENTION

Accordingly, the present invention is directed to an organic EL device that substantially obviates one or more problems due to limitations and disadvantages of the related art.

An object of the present invention is to provide an organic EL device, by which optical efficiency and stability of the organic EL device are enhanced by providing an anode of high reflectivity, high work function, superior environmental characteristic, and favorable corrosion resistance to a top-emission type organic EL device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic EL device according to the present invention includes an anode, an organic layer on the anode, and a cathode on the organic layer, wherein the anode comprises a reflective layer reflecting light emitted from the organic layer and a hole injection layer on the reflective layer injecting holes.

Preferably, the reflective layer is formed of Al.

Preferably, the reflective layer is formed by adding one element selected from the group consisting of Nd, Ta, Nb, Mo, W, Ti, Si, B, and Ni to Al.

More preferably, the one element is added at about 5 at. % to the Al.

Preferably, the hole injection layer is formed of an alloy including at least one or two selected from the group consisting of Cr, Ni, Ti, Mo, and Au.

More preferably, the hole injection layer is 1 nm~10 nm thick.

Preferably, the reflective layer and the hole injection layer are formed by one selected from the group consisting of resistance heating, sputtering, and E-beam deposition.

Preferably, the organic EL device is a top-emission type organic EL device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
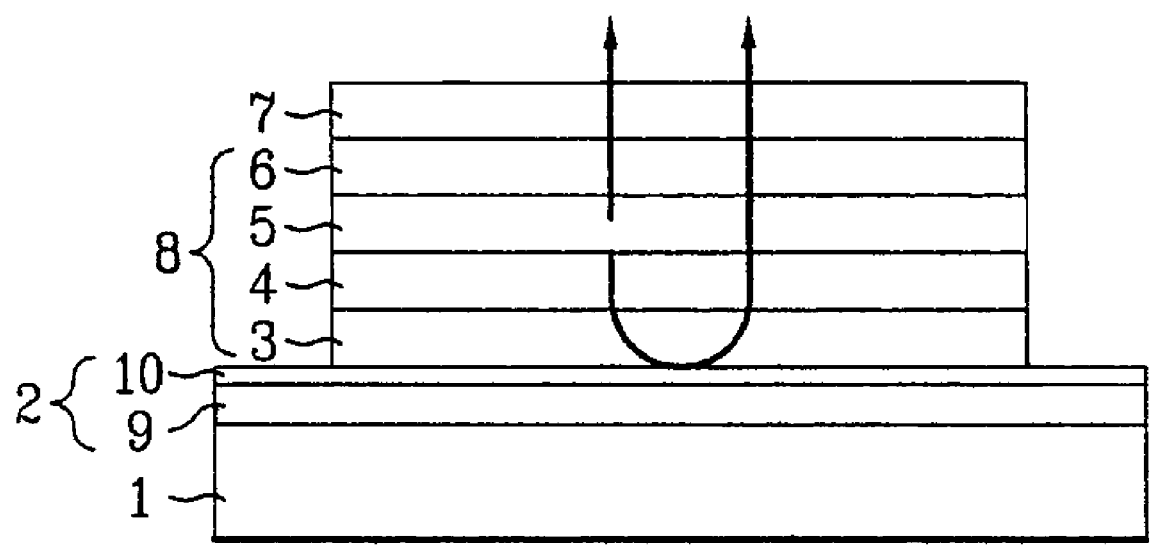
FIG. 1 is a cross-sectional diagram of a top-emission type organic EL device according to the present invention.

FIG. 1 is a cross-sectional diagram of a top-emission type organic EL device according to the present invention.

Referring to FIG. 1, an anode 2 of an organic EL device according to the present invention includes a reflective layer 9 on a substrate 1 and a hole-injection layer 10, thereby configuring a stacked double layer.

The anode 2 plays a role in injecting holes and reflecting light emitted from an organic emitting layer 5.

In order for the reflective layer 9 to reflect the emitted light, a substance forming the reflective layer 9 should have high reflectivity across an overall visible ray area. Al and Ag layers are the only mono-atomic metal layers existing within the visible ray area having a wavelength range of 400 nm~700 nm to indicate the reflectivity exceeding 80%.

In case of Al layer, reflectivity rapidly drops in the area of 500 nm~550 nm to indicate about 40% reflectivity in 470 nm.

Hence, only Al or Ag can be used as the base metal for forming the reflective layer 9. The organic EL device according to the present invention uses Al or Al-alloy formed by adding one of Nd, Ta, Nb, Mo, W, Ti, Si, B, and Ni at 5 at. % to Al.

Alloy containing one or two of Cr, Ni, Ti, Mo, and Au is used as the hole-injection layer 10. This is because the additive elements are the metal having superior environmental characteristics and high work function.

The hole-injection layer 10 is formed 1 nm~10 nm thick.

If formed thicker than 10 nm, the hole-injection layer 10 absorbs light to reduce an effect of the reflective layer 9 beneath the hole-injection layer 10, thereby decreasing optical efficiency thereof.

On the other hand, if the hole-injection layer 10 formed thinner than 1 nm, low work function of the Al or Al-alloy layer of the reflective layer 9 degrades the I-V characteristic.

In doing so, the reflective layer 9 or the hole-injection layer 10 can be deposited by resistance heating, sputtering, E-beam deposition, or the like.

Meanwhile, an organic layer 8 is deposited on the anode 2 constructed with the double layer of the reflective and hole-injection layers 9 and 10. And, a cathode 7 is formed on the organic layer 8 to inject electrons and transmitting the emitted light.

The organic layer 8 includes a hole injecting layer (HIL) 3, a hole transport layer 4, an organic emitting layer 5, and an electron transport layer 6.

The hole injecting layer 3 is mainly formed of CuPc (copper phthalocyanine) of 10 nm~30 nm thick.

The hole transport layer (HTL) 4 is formed on the hole injecting layer 3 by depositing TPD or NPD of 30 nm~60 nm thick.

The organic emitting layer 5 is formed on the hole transport layer 4. In doing so, a dopant is added. In case of green luminescence, about 30 am~60 am of $Alq_3$ {tris-(8-hydroxy-quinolate)aluminum} is deposited as the organic emitting layer 5 and Coumarin 6 or Qd (quinacridone) is mainly used as a dopant.

And, the electron transport layer 6 (ETL) is formed on the organic emitting layer 5.

The above-configured organic EL device according to the present invention has high reflectivity and optical efficiency.

Implementations for further enhanced reflectivity and optical efficiency according to embodiments of the present invention are explained by referring to the attached drawings as follows.

Figure 2:
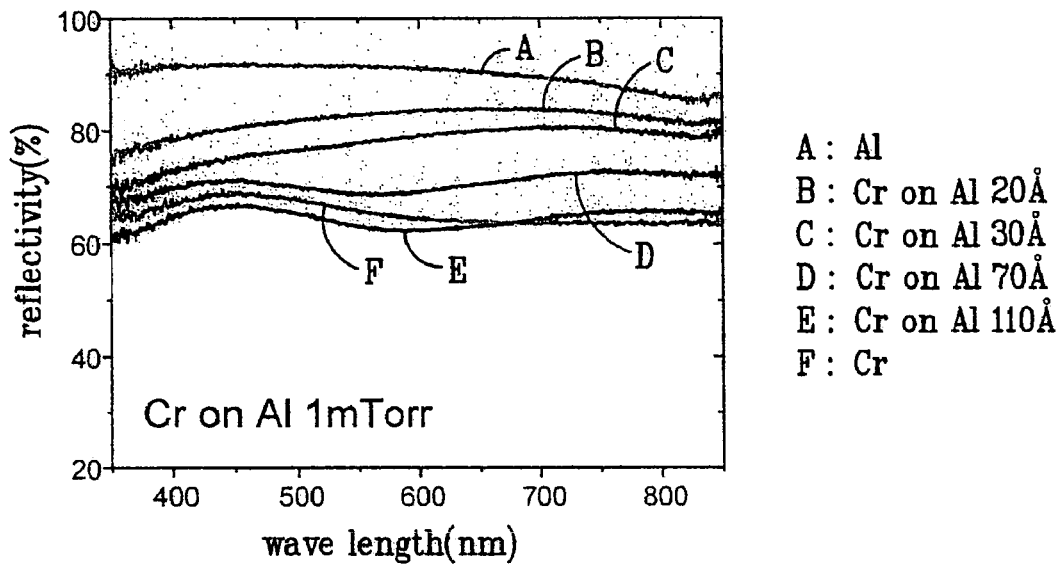
FIG. 2 is a graph of reflectivity variation depending on thickness of Cr layer on Al layer according to a first embodiment of the present invention.

FIG. 2 is a graph of reflectivity variation depending on thickness of Cr layer on Al layer according to a first embodiment of the present invention.

Referring to FIG. 2, the anode 2 includes the reflective layer 9 of Al and the hole injection layer 10 of Cr.

Al layer is deposited 150 nm thick using 4" target of 99.999% at 200 W and 2 mTorr. Cr layers are deposited 2 nm, 3 nm, 7 nm, and 11 nm thick, respectively using 4" target of 99.999% at 200 W and 1 mTorr.

As shown in the drawing, the more the thickness of Cr increases, the more overall reflectivity of the anode 2 decreases.

In case that the thickness of Cr exceeds 1 nm, the corresponding reflectivity is lower than reflectivity of the single Cr layer. Hence, it is unable to achieve the object of the present invention in improving the reflectivity.

By providing Cr with the thickness less than 10 nm, the reflectivity can be improved.

In doing so, if the deposition condition of Cr is varied to 10 mTorr, the corresponding reflectivity is greater than that of the Cr layer deposited at 1 mTorr.

As a result of XRD (X-ray diffraction) analysis, density of the Cr layer is 5.75 $g/cm^3$ at 1 mTorr or 4.14 $g/cm^3$ at 10 mTorr, whereby the density of Cr layer at 1mTorr is higher than that at 10 mTorr. Yet, in case of 10 mTorr, the overall reflectivity of the anode 2 is reduced as the thickness of Cr increases.

Figure 3:
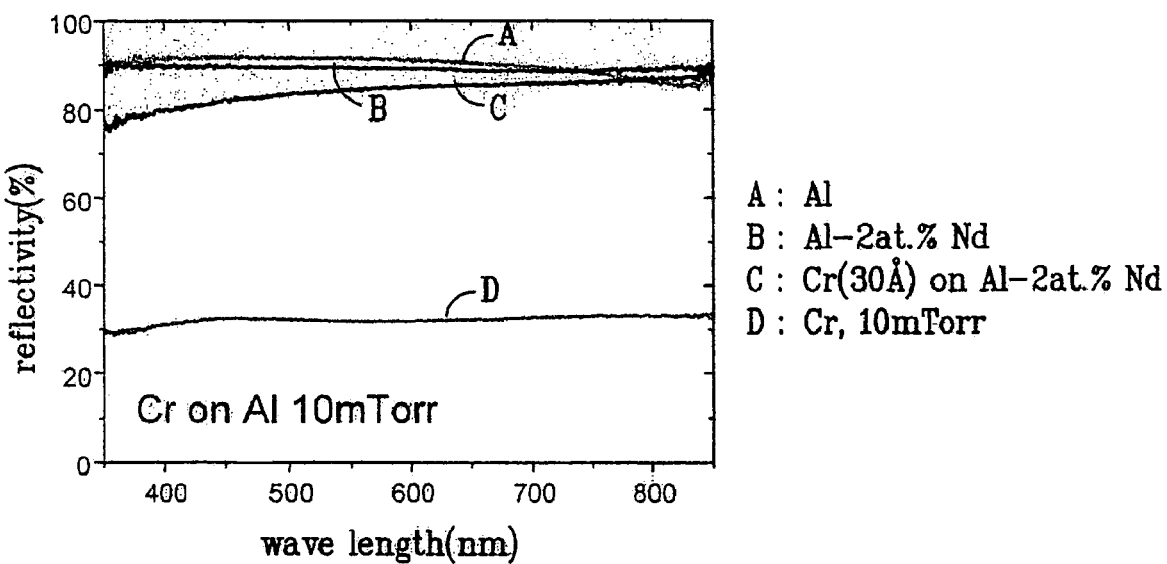
FIG. 3 is a graph of reflectivity variation depending on thickness of Cr layer on Al—Nd alloy reflective layer according to a second embodiment of the present invention.

FIG. 3 is a graph of reflectivity variation depending on thickness of Cr layer on Al—Nd alloy reflective layer according to a second embodiment of the present invention.

Referring to FIG. 3, instead of the Al layer, the reflective layer 9 for the anode 2 is formed 150 nm thick using 4" Al-2 at. % Nd alloy target of 99.999% at 200 W and 1 mTorr.

And, a Cr layer as the hole injection layer 10 is formed 3 nm thick on the reflective layer 9 using 4" target of 99.999% at 200 W and 10 mTorr.

Compared to the reflectivity of the case of the mono-atomic Al layer, reflectivity in the visible ray area is reduced about 2% in case of using the 2 at. % Nd-added Al target.

Yet, even if the Cr layer is deposited on the Al—Nd layer, it can be checked that there is almost no variation of the reflectivity of the Al—Nd layer.

Thus, if the alloy formed by adding one of Nd, Ta, Nb, Mo, W, Ti, Si, B, and Ni at about 5 at. % to Al is used as the reflective layer 9, reduction of the reflectivity almost fails to take place but resistance against electromigration increases.

Moreover, surface illumination intensity can be maintained in performing annealing and subsequent processes.

Figure 4:
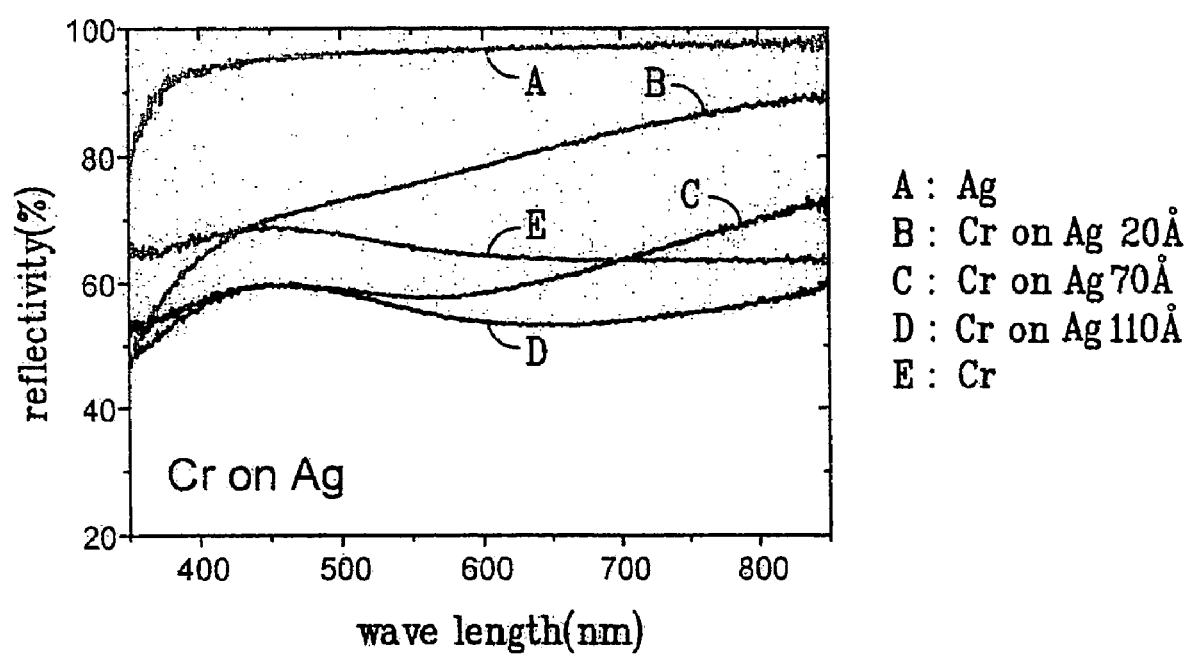
FIG. 4 is a graph of reflectivity variation in using Ag as a reflective layer for the comparison to the present invention.

FIG. 4 is a graph of reflectivity variation in using Ag as a reflective layer 9 for the comparison to the present invention.

Namely, instead of using Al or Al-alloy formed by adding one of Nd, Ta, Nb, Mo, W, Ti, Si, B, and Ni at 5 at. % to Al, Ag having excellent reflectivity in the visible ray area is used as the reflective layer 9.

Referring to FIG. 4, in case of using Ag as the reflective layer 9, reflectivity of the anode 2 is reduced as the thickness of the Cr layer increases.

Yet, Ag of the anode 2 is not effective since rapid reflectivity reduction occurs in short wavelength band of blue and green.

Thus, in case of the anode 2 deposited by differentiating the hole injection layer 10 and the reflective layer 9 of the organic EL device according to the present invention, it is preferable that Al or Al-alloy formed by adding one of Nd, Ta, Nb, Mo, W, Ti, Si, B, and Ni at 5 at. % to Al is uses as the reflective layer 9.

Moreover, metal having superior environmental characteristics and high work function such as Cr, Ni, Ti, Mo, and Au is preferably used as the hole injection layer 10 and is preferably deposited 1 nm~10 nm thick.

Accordingly, the organic EL device according to the present invention constructs the anode 2 with the double layer including the hole injection layer 10 and the reflective layer 9, thereby providing the following effects or advantages.

First of all, the reflectivity of the anode of the present invention is improved about 15%~20% higher than that of the related art organic EL device, thereby reducing a drive current of the organic EL device thereof.

Secondly, the metal having superior environmental characteristics and high work function is used as the hole injection layer, whereby optical efficiency is enhanced and the device endurance is elongated.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic EL device comprising:
   a first electrode comprising a reflective layer reflecting light emitted from an organic layer and a hole injection layer on the reflective layer injecting holes; and
   a second electrode on the organic layer,
   wherein the organic layer is on the first electrode, and
   wherein the hole injection layer is formed of an alloy including at least one or two selected from the group consisting of Cr, Ni, Ti and Mo and the reflective layer is formed by adding one element selected from the group consisting of Nd, Ta, Nb, Si and B to Al.

2. The organic EL device of claim 1, wherein the one element is added at about 5 at. % to the Al.

3. The organic EL device of claim 1, wherein the hole injection layer is 1 nm~10 nm thick.

4. The organic EL device of claim 1, wherein the reflective layer and the hole injection layer are formed by one selected from the group consisting of resistance heating, sputtering, and E-beam deposition.

5. The organic EL device of claim 1, wherein the organic EL device is a top-emission type organic EL device.

* * * * *